United States Patent
Kim et al.

(10) Patent No.: US 9,525,514 B2
(45) Date of Patent: Dec. 20, 2016

(54) SYSTEM AND METHOD FOR DECODING BLOCK OF DATA RECEIVED OVER COMMUNICATION CHANNEL

(71) Applicant: Mitsubishi Electric Research Laboratories, Inc., Cambridge, MA (US)

(72) Inventors: Kyeong Jin Kim, Lexington, MA (US); Philip Orlik, Cambridge, MA (US); Toshiaki Koike-Akino, Malden, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 14/604,871

(22) Filed: Jan. 26, 2015

(65) Prior Publication Data

US 2016/0218827 A1 Jul. 28, 2016

(51) Int. Cl.
| | |
|---|---|
| *H04L 27/08* | (2006.01) |
| *H01Q 11/12* | (2006.01) |
| *H04L 1/00* | (2006.01) |
| *H04B 7/04* | (2006.01) |
| *H03C 3/40* | (2006.01) |
| *H04L 25/02* | (2006.01) |
| *H04L 25/03* | (2006.01) |

(52) U.S. Cl.
CPC ............... *H04L 1/0054* (2013.01); *H03C 3/40* (2013.01); *H04B 7/0413* (2013.01); *H04L 25/03286* (2013.01); *H04L 25/0246* (2013.01); *H04L 25/03216* (2013.01); *H04L 25/03891* (2013.01)

(58) Field of Classification Search
CPC ............... H04L 1/0054; H04L 25/0202; H04L 25/03197; H04L 7/042; H04L 1/0059; H04L 1/0042; H04L 2027/003
USPC .......................................... 375/345; 455/118
See application file for complete search history.

(56) References Cited

U.S. PATENT DOCUMENTS

| | | | | |
|---|---|---|---|---|
| 5,487,179 | A * | 1/1996 | Larsson | H04B 1/40 370/278 |
| 6,201,802 | B1* | 3/2001 | Dean | H04W 56/001 370/328 |
| 8,116,411 | B2* | 2/2012 | Chockalingam et al. | 375/341 |
| 8,503,584 | B2* | 8/2013 | Zilberman et al. | 375/340 |
| 2002/0025785 | A1* | 2/2002 | Satoh | H03K 17/76 455/78 |
| 2003/0087613 | A1* | 5/2003 | Bellaouar | H04B 1/0475 455/91 |
| 2004/0085161 | A1* | 5/2004 | Kushitani | H03H 9/0542 333/195 |
| 2005/0014476 | A1* | 1/2005 | Oono | H03C 3/40 455/118 |

(Continued)

*Primary Examiner* — Daniel Washburn
*Assistant Examiner* — Sarah Hassan
(74) *Attorney, Agent, or Firm* — Gene Vinokur; James McAleenan; Hironori Tsukamoto

(57) ABSTRACT

A method decodes a block of data received over a communication channel. The method determines an initial estimate of bits in the block using a QR decomposition (QRD-M) method decoding the bits in the block sequentially by reducing an accumulated distance between the initial estimate and the bits of the block. Then, the method determines the block using a likelihood ascent (LAS) method that iteratively updates the bits of the block starting from the initial estimate.

9 Claims, 10 Drawing Sheets

(56) References Cited

U.S. PATENT DOCUMENTS

2006/0014513 A1* 1/2006 Uozumi ............... H03C 3/0925
                                                      455/323
2007/0171312 A1* 7/2007 Kishi .................... H03D 3/007
                                                      348/726

* cited by examiner

SYSTEM AND METHOD FOR DECODING BLOCK OF DATA RECEIVED OVER COMMUNICATION CHANNEL

FIELD OF THE INVENTION

This invention relates generally to digital communications, and more particularly to decoding block of data received over communication channel.

BACKGROUND OF THE INVENTION

A multiple-input multiple-output (MIMO) system uses multiple transmit and receive antennas. The MIMO system can increase channel transmission capacity in proportion to the number of antennas without allocating additional frequency or transmission power, as compared to a system using a single antenna. The channel capacity of the MIMO system mainly depends on a signal detecting method used in a receiver in order to recover blocks of transmitted symbols. It is important to design the signal detecting method of the MIMO system so that high performance, low complexity and detection delay are achieved. This is a particular problem for doubly-selective channels that are subject to time-varying fading and multi-path delays, where both inter-carrier interference (ICI) and inter-symbol interference (ISI) occur.

An example of the signal detecting method of the MIMO system may include a maximum likelihood (ML) detecting method, a sphere decoding algorithm, a QR-decomposition with M-algorithm (QRD-M) algorithm, and so on.

Although the ML detecting method provides optimal performance in a MIMO system, the operational complexity exponentially increases when the number of transmitting antennas increases and a higher order modulation method is used. Therefore, there is a disadvantage in that the ML detecting method is not practically used.

The sphere decoding algorithm provides performance similar to that of the ML method and the significantly reduced average operation complexity as compared to the ML detecting method. However, the sphere decoding algorithm instantaneously changes complexity due to the condition number of a channel matrix and the noise dispersion. As a result, the sphere decoding algorithm represents an operational complexity similar to the ML method in a worst case scenario. In other words, the operational complexity of the sphere decoding algorithm has a large standard deviation and randomness. Therefore, it is difficult to apply the sphere decoding algorithm to applications where a mobile base station has limited power and low detection latency tolerance.

The QRD-M method is provided as a compromise between performance and complexity. In the QRD-M method, the amount of computation required to detect signals is fixed regardless of channel conditions or noise power. Therefore, the QRD-M method detecting the signals considers more information at each process, thereby making it possible to further reduce the operational complexity. In other words, when there is well-conditioned channel environment or low noise power, the QRD-M method reduces the number of remaining candidate symbols, thereby reducing operations relating to accumulated distances calculated at each branch. However, the detection performance of the QRD-M method depends on the number of selected candidates and the more the number of candidates, the larger the operational complexity becomes.

SUMMARY OF THE INVENTION

The channel variation over a single block of symbols transmitted on a doubly selective channel is not negligible due to both ICI and ISI. Maximum Likelihood Detection (MLD) is unfeasible in high data rate MIMO systems. Several detection methods can achieve near-MLD performance. For example, QR decomposition with M-algorithm, i.e., a QRD-M method, reduces the complexity by selecting M candidates with the smallest accumulated metrics at each level of the tree search.

However, to achieve near-MLD performance for a QRD-M algorithm, M should be made large, thereby necessitating higher computational complexity, which is undesirable. Another likelihood ascent search (LAS) method for low-complexity large MIMO detection achieves a near-maximum likelihood (ML) performance, but only for the systems with hundreds of antennas. Placing hundreds of antennas can be difficult in communication terminals that have space constraints. In addition, the LAS method performs well only for relatively large blocks of transmitted data.

Some embodiments of the invention are based on a recognition that for different sizes of the blocks of data transmitted over multiple communication channels different types of detectors can be more optimal than the others, especially considering limiting computational resources of the receivers. For example, for the block of one size to be detected by a receiver of predetermined computational power, the QRD-M can be more optimal than the LAS. The size of the small block and the value of M are governed by the computational power of a decoder. With the increase of the size of the block, the LAS method can become more optimal.

Some embodiments of the invention are based on recognition that a combination of QRD-M and LAS can be used to detect block of data of different sizes. For example, an output of QRD-M with possibly suboptimal M can serve as an input to the iterations of LAS. Such a combination works better for decoding medium sized block of data by a decoder with limited computational power. Moreover, some embodiments are based on another realization that varying the value of M and a number of iterations of LAS the dominance of QRD-M or LAS methods over one other can be varied.

Accordingly some embodiments are based on a realization that the method for detecting the block should be selected as a function of the size of the block. Various embodiments of the invention describe different combinations of the detectors for different sizes of the block of transmitted data and provide a method for selecting one or combination of the detectors based on the size of the block and/or computational power of the receivers.

Accordingly, one embodiment discloses a method for decoding a block of data received over a communication channel. The method includes determining an initial estimate of bits in the block using a QR decomposition (QRD-M) method, wherein the QRD-M method decodes the bits in the block sequentially by reducing an accumulated distance between the initial estimate and the bits of the block; and determining the block using a likelihood ascent (LAS) method, wherein the LAS method iteratively updates the bits of the block starting from the initial estimate, wherein steps of the method are performed by a processor of a receiver.

Another embodiment discloses a receiver including at least one antenna for receiving a block of data over a communication channel; and a processor for decoding the block of data, wherein the processor is configured for determining an initial estimate of bits in the block using a QR decomposition (QRD-M) method and determining the block using a likelihood ascent (LAS) method iteratively updating the bits of the block starting from the initial estimate.

DETAILED DESCRIPTION OF THE PREFERRED EMBODIMENTS

Figure 1:
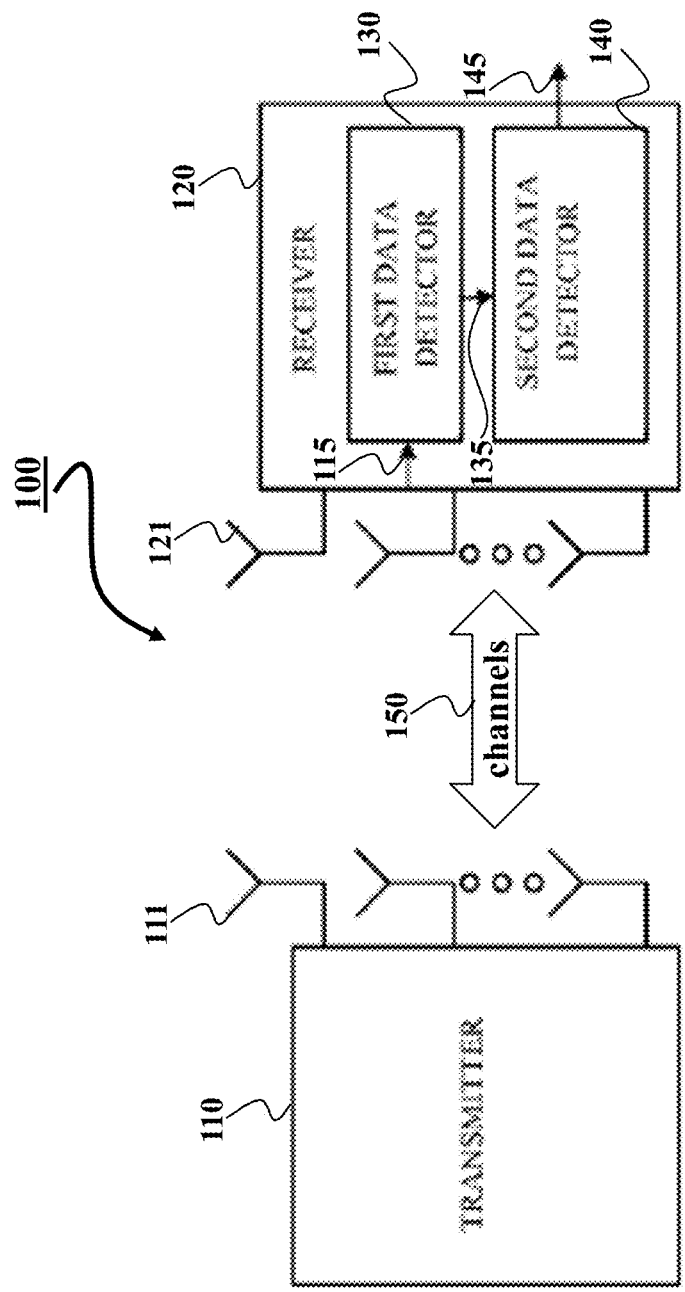
FIG. 1 is a schematic of a communication system employing some principles of the invention.

FIG. 1 shows a schematic of a system 100 employing some embodiments of the invention. The system 100 includes a transmitter 110 and a receiver 120 communicating via channels 150. The system can be a multiple-input multiple-output (MIMO) system, in which the transmitter and/or the receivers use one or multiple antennas 111, 121. Both the transmitter and the receiver can include processors and memory for processing transmitted data, and at least one RF chain connected to the antennas.

The MIMO system can increase transmission capacity of the channels 150 in proportion to the number of antennas without allocating additional frequency or transmission power, as compared to a system using a single antenna. However, some embodiments of the invention consider a point-to-point communication system with a single antenna at the transmitter and receiver.

Some embodiments are based on a general realization that block of the data transmitted over a communication channel can be better detected by a combination of the detectors rather than a single detector. The combination of the detectors can be selected, e.g., based on a size of the transmitted block of data and/or computational power of the receiver.

For example, the receiver 120 includes a first detector 130 and a second detector 140. The first detector provides an initial estimation of the transmitted block of data 115. The initial estimation 135 can be suboptimal but instead of outputting that suboptimal detection, the initial estimation 135 serves as an input to the second detector 140 that revises the initial estimation to detect 145 the block of data. In such a manner, even if the detectors can be designed to be suboptimal, e.g., due to limited computational resources of the receiver, as long as the combination of the detectors provides the acceptable detection accuracy.

Figure 2:
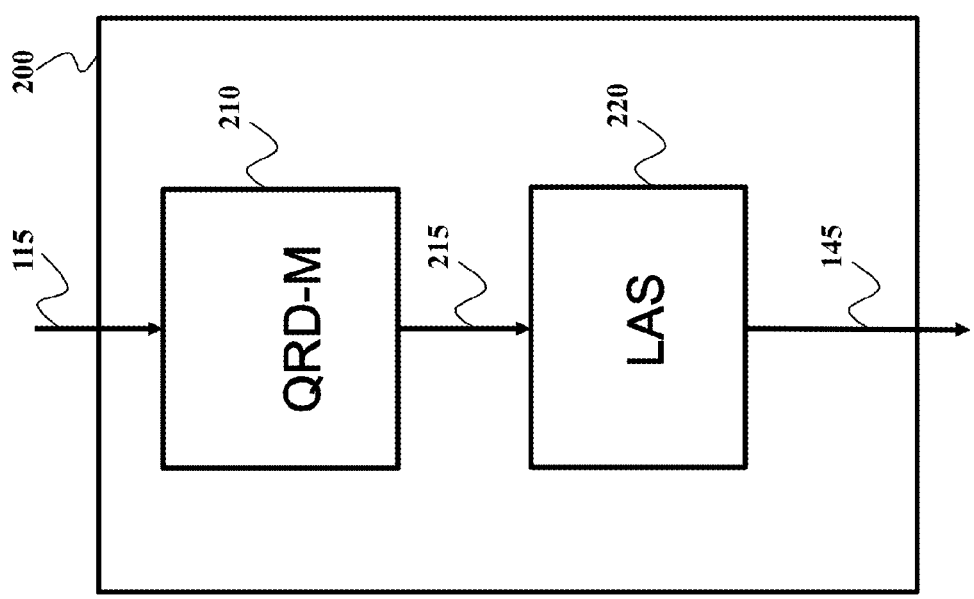
FIG. 2 is an example of the implementation of a decoder according to one embodiment of the invention.

FIG. 2 shows an example of the implementation of a decoder 200 of the receiver 120 according to one embodiment of the invention. This embodiment is based on a specific realization that a combination of QR decomposition with M (QRD-M) and likelihood ascent search (LAS) methods can be used together to detect block of data of different sizes. For example, an output of QRD-M with possibly suboptimal M can serve as an input to the iterations of LAS.

This embodiment is advantageous for the receivers with limited computational power. The QRD-M method reduces the complexity by selecting M candidates with the smallest accumulated metrics at each level of the tree search. The optimal value of M increases with the increase of the size of the block of data to be detected. However, the maximal value of M in the QRD-M is governed by the computation power of a processor of the decoder. For blocks 115 having sufficiently small size, the maximal possible value of M can be sufficient to optimally decode the block of data. In such situations, the QRD-M method is better than LAS.

For example, consider the optimal ML-detector, which has the form $$\hat{x} = argmax_{x \in \mathbb{M}} \{f_{y|x,H}(y|\hat{x},H)\},$$

where a vector of length N $\hat{x}$, denotes the estimate of the transmitted block, and where N corresponding to the size of the block that is being detected. $f_{y|x,H}(\bullet)$ is the likelihood function of the received block, y, given the transmitted block, x, and the channel H. Note the following dimensions of the variables in the above: x is again a vector of length N, where each of the elements represents a modulation symbol drawn from an alphabet of size $\mathbb{M}$. For example, if QPSK modulation is employed at the transmitter, then $\mathbb{M}=4$. H is an N×N matrix of complex valued channel coefficients.

Thus, an ML detector tests all possible transmitted blocks, x, and chooses the one that maximizes $f_{y|x,H}(y|x=\hat{x},H)$ for the given channel. The number of possible transmitted blocks that need to be tested depends on both the size of the alphabet $\mathbb{M}$ and the size of the block, N, and can be written explicitly as $\mathbb{M}^N$. For an example tree diagram with N=3 and $\mathbb{M}=4$, there are a total of $4^3=64$ possible blocks and thus a total of 64 length 3 paths that are potential solutions. The ML detector tests all 64 paths.

The QRD-M method treats the detection problem as a tree-search problem where each of the $\mathbb{M}^N$ possible blocks is represented by a length N path through a tree with N+1 levels. The QRD-M detector operates by iteratively pruning the number of paths that are searched in the tree to just M. That is at each level, M*$\mathbb{M}$ branch metrics are computed, which is also the number of length N paths that are tested by the QRD-M detector. Accordingly, as used herein, the optimal value of M for the QRD-M detector is such a value that allows QRD-M detector to obtain the exact ML detector performance, i.e., the optimal value of M is such that M $\mathbb{M}$ = $\mathbb{M}^N$. Solving for M yields $$M = \frac{\mathbb{M}^N}{\mathbb{M}} = \mathbb{M}^{N-1}.$$

This is the optimal value of M in the sense that the QRD-M detector and the ML detector are equivalent.

For small block sizes and low modulation orders setting $M=\mathbb{M}^{N-1}$ can be feasible from a computational and memory perspective. However, the benefit of the QRD-M detector is its ability to obtain near ML performance with values of M much less than $\mathbb{M}^{N-1}$. As a rule of thumb, setting $M=N*\mathbb{M}$ is large enough so that the performance that is very close to the ML detector. We note that while the setting of $M=N*\mathbb{M}$ produces a detector with near-ML performance it is still a sub-optimal setting in the sense that the ML detector provides a lower bound on the achievable detection performance. For any value of M and modulation alphabet size $\mathbb{M}$, the QRD-M method eventually computes $N*M*\mathbb{M}$ branch metrics. For a setting of $M=N*\mathbb{M}$ the number of branch metric computations becomes $N^2\mathbb{M}^2$ and is the typical number of QRD-M branch metric computations that are needed to obtain near ML-performance.

Generally, to achieve near-MLD performance for a QRD-M algorithm, M should be made large, thereby necessitating higher computational complexity, which is undesirable. Accordingly some embodiments of the invention use sub-optimal value of M for the QRD-M method. As used herein, the suboptimal value of M of the QRD-M method is $M \leq N*\mathbb{M}$.

Another likelihood ascent search (LAS) method for low-complexity large MIMO detection achieves a near-maximum likelihood (ML) performance, for relatively large blocks of transmitted data. LAS is a greedy search algorithm that also attempts to iteratively improve its estimate of the transmitted block $\check{x}^{(i)}$, by finding a new estimate $\check{x}^{(i+1)}$ that has a larger likelihood value.

That is, $f_{y|x,H}(y|x=\check{x}^{(i+1)},H) > f_{y|x,H}(y|x=\check{x}^{(i)},H)$ for $i=0, \ldots N_{iter}-1$. Where i is the iteration count, $N_{iter}$ is the maximum number of iterations in the LAS algorithm and $\check{x}^{(i)}$ is the estimate of the transmitted block at the $i^{th}$ iteration of the LAS algorithm. In each iteration of the LAS algorithm, each of the N symbols in $\check{x}^{(i)}$ is checked/tested to see if replacing the symbol with another value from the modulation alphabet, $\mathbb{M}$, will increase the likelihood function.

Because, the LAS is a greedy algorithm, the LAS can converge to a local maxima rather than a global optimal maximum. However, the increase in dimensionality of the LAS reduces the probability that for a given starting point (initial estimate $\check{x}^{(0)}$) converges to a local minimum. Another words, the increase in dimensionality of LAS at each iteration increase the probability of finding a dimension that improves the likelihood. For i.i.d. channels (the elements of the matrix H are independent and identically distributed), it can be shown that as the block size tends to infinity the performance of LAS converges to the ML performance. While infinitely long block sizes are not feasible in practice, usually a block size of in the range of 200-400 is sufficient observe ML performance.

However, some embodiments are based on recognition that LAS can be effective for smaller sizes of the block of transmitted data if a starting point of the LAS is selected such that the initial estimate $\check{x}^{(0)}$ differs from the ML solution in a few locations. This ensures that the LAS algorithm starts near the global optimum solution. This requirement that the initial estimate is close to the ML solution is needed since that small block size inhibits the ability of the LAS algorithm to recover from initial starting points that are near local minima. Moreover, some embodiments of the invention are based on realization that the output of the QRD-M even with suboptimal value of M can provide such an initial estimate.

Accordingly, in one embodiment, a decoder for decoding a block of data received over a communication channel includes a first detector for determining an initial estimate 215 of bits in the block 115 using a QRD-M method 210 decoding the block sequentially by reducing an accumulated distance between the initial estimate and the bits of the block, and includes a second detector for determining the block using a LAS method 220 iteratively updating the bits of the block starting from the initial estimate.

In some embodiments, the size of the block of data to be transmitted is known in advance. In those embodiments, the values of M for the QRD-M detector and a number of iterations N for the LAS detector are optimized for that size and the computational power of the decoder. For example, assume that the decoder has memory that is large enough to store q branch metrics, then the maximal value that the M parameter can be set to is q. The maximum number of iterations in the LAS portion of the decoder, $N_{iter}$, can then be set according the processing speed of the decoder.

However, in some situations, the size of the block of data is unknown until received. For example, in variable length data transmission such as designed according to the IEEE 802.11 standard, where the size of the block is variable and the size is provided in a data packet header.

For those situations, some embodiments of the invention determine values of M and $N_{iter}$ for an average size of the block. Alternative embodiments, however, vary the value of M and a number of iterations $N_{iter}$ of LAS in dependence of the size of the block. Those embodiments are based on recognition that for small size of the block the maximal possible value of M can be sufficient to decode the block, so there is no need to heavily rely on the LAS. In contrast, for the large sizes of the block, the LAS method does not need a good initial estimation from the QRD-M to detect the block and complexity of the QRD-M method can be further reduced.

Figure 3:
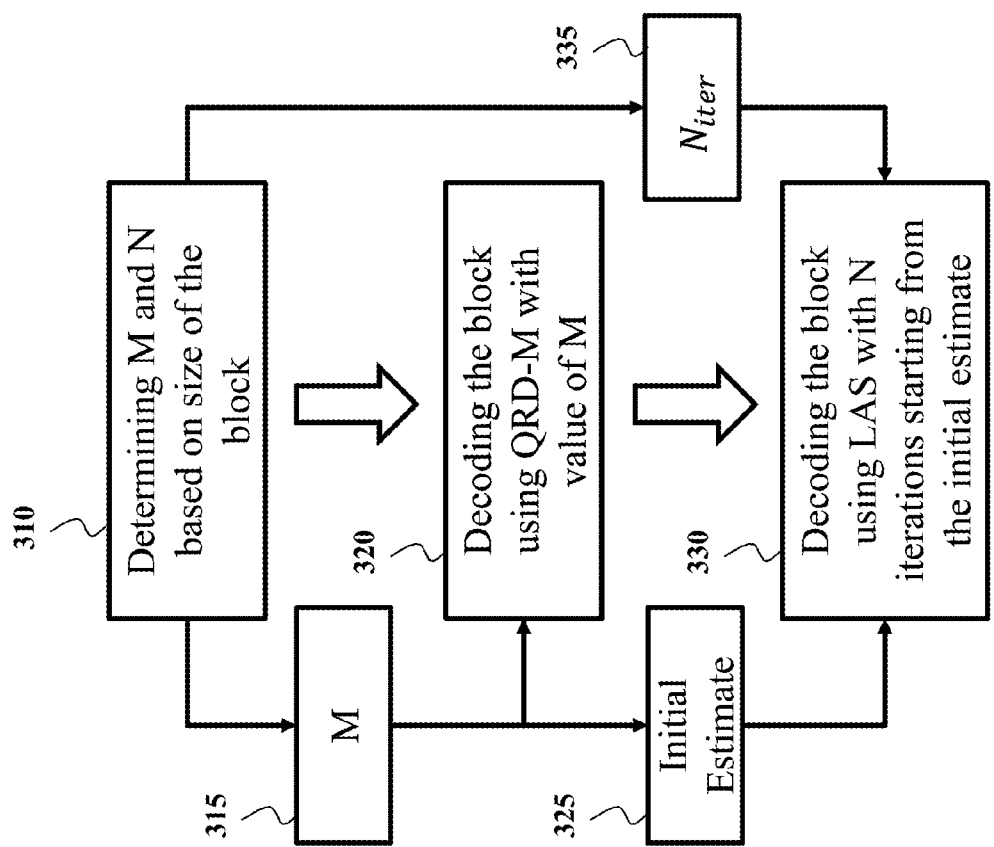
FIG. 3 is a block diagram of a method that adaptively vary the dominance of decoding methods according to some embodiment of the invention.

FIG. 3 shows a block diagram of a method according to some embodiments that adaptively select the value of M and/or a number of iterations $N_{iter}$ of LAS to vary the dominance of QRD-M and the LAS methods over each other in the decoder. The method determines 310 at least one of a value of M 315 for the QRD-M method and a number of the iterations 335 for the LAS method based on a size of the block, wherein M is a number of surviving paths in each stage of the QRD-M method. Next, the method decodes 320 the block using QRD-M with value of M 315 to determine the initial estimate 325 of the block, and decodes 330 the block using LAS with $N_{iter}$ 335 iterations starting from the initial estimate 325.

Figure 4:
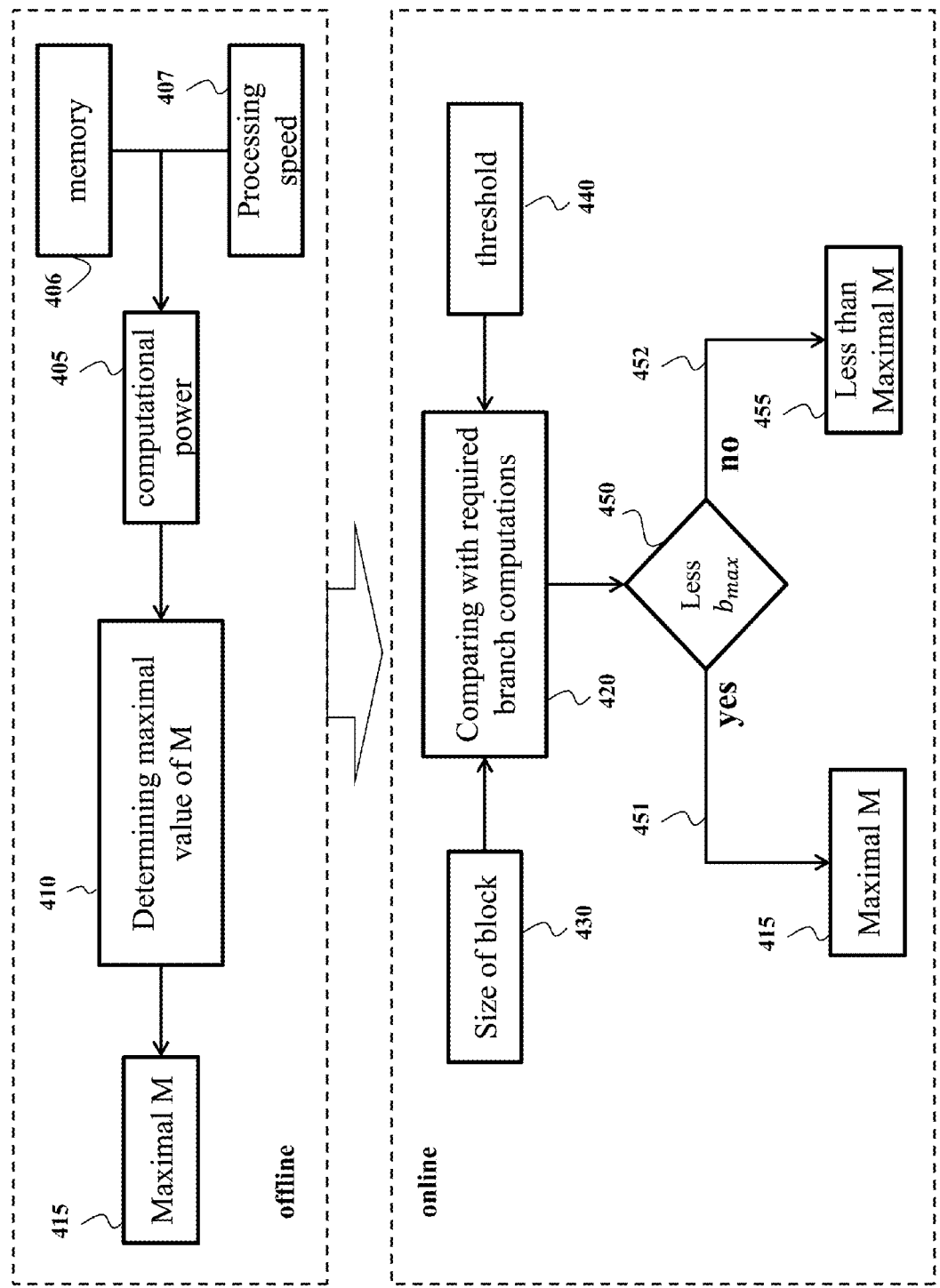
FIG. 4 is a block diagram of a method for determining a value of M for the QRD-M method according to some embodiment of the invention.

FIG. 4 shows a block diagram of a method for determining the value of M for the QRD-M method. The method determines 410 a maximal value of M for the QRD-M method in dependence of a computational power 405 of the receiver decoding the data, which can included at least one of a size of a memory 406 and a computational speed or processing speed 407 of a processor of the receiver. In some implementation, this steps of performed offline. For example, if a receiver has memory large enough to hold q branch metrics and the processing speed 407 at least fast enough to compute $b_{max}$ branch metrics in a detection interval, then, for a given alphabet size and block size, the maximal value of M that can be supported by the hardware is $$M_{max} = \min\left(q, \left\lfloor \frac{b_{max}}{N\mathbb{M}} \right\rfloor\right).$$

Essentially, the maximal value of M is determined by memory and processing limitations of the hardware.

During the online decoding, the decoder of the receiver compares 420 the size of the block 430 with a threshold 440, and selects 450 the maximal value of M 415 for the QRD-M method if a size of the block is less 451 than a threshold, and otherwise 452 selects a value of M less than the maximal value of M. This embodiment is counterintuitive in a sense that the value of M is decreased when the size of the block is increased. However, this embodiment allows reducing the complexity of the QRD-M method when such a complexity is not necessary. In some embodiments, the value of M is selected as one to reduce the effect of the QRD-M methods to its minimum.

In some embodiments, the threshold is selected by considering that q is the hardware constraint on the maximum value of M. Thus, the receiver computes 420 N*q*M and checks to see if this is larger than $b_{max}$. If so, then the value of M used in the QRD-M algorithm is set to $M_{max}$, 415. It is possible that $M_{max}$ is larger than $N*\mathbb{M}$, in this case the detector can consider that the given system parameters: the block size N, alphabet size, $\mathbb{M}$, and processing power, $b_{max}$ are such that QRD_M alone can process the received block. In the case when, $M_{max} < N*\mathbb{M}$ the detector will sequentially perform a QRD-M detection and LAS detection with the output of the QRD-M detection acting as the initial estimate, $\check{x}^{(0)}$, for the LAS detection. In this case the value of M depends on blocksize and can be computed $$M = \max(1, \lceil 256/N \rceil)$$

where ⌈•⌉ denotes the ceiling function. The value of 256 shown above is suggested by the fact that for large blocks (>200 symbols) the LAS algorithm performs better than the QRD-M algorithm when M is less than the optimal rule of thumb value of $M=N*\mathbb{M}$. Additionally, as the block size increases, some embodiments allow the LAS algorithm to handle more of the detection processing. Other functional relations that reduce the M parameter value as the block size increases are also appropriate. However, setting $M=M_{max}$ independent of the block size may cause unnecessary complexity in the QRD-M portion of the detector, 320.

Additionally or alternatively to selecting a value of M for QRD-M method, some embodiments select the number of iterations for the LAS method 330. Because the LAS method finds a local minima of the likelihood function, some embodiments do not adapt the number of iterations, $N_{iter}$. Essentially, after a number of iterations the LAS method converges to a minimum and additional iterations no longer result in improved performance. Accordingly, some embodiments test each new estimated block $\check{x}^{(i)}$ to see if any of the components have changed from the previous estimate $\check{x}^{(i-1)}$. If so, then further iterations are potentially needed.

However, some embodiments limit the total number of iteration allowed so as to minimize the number of computations carried out for each block and or to emphasize the dominance of the ORD-M method over the LAS method.

Figure 5:
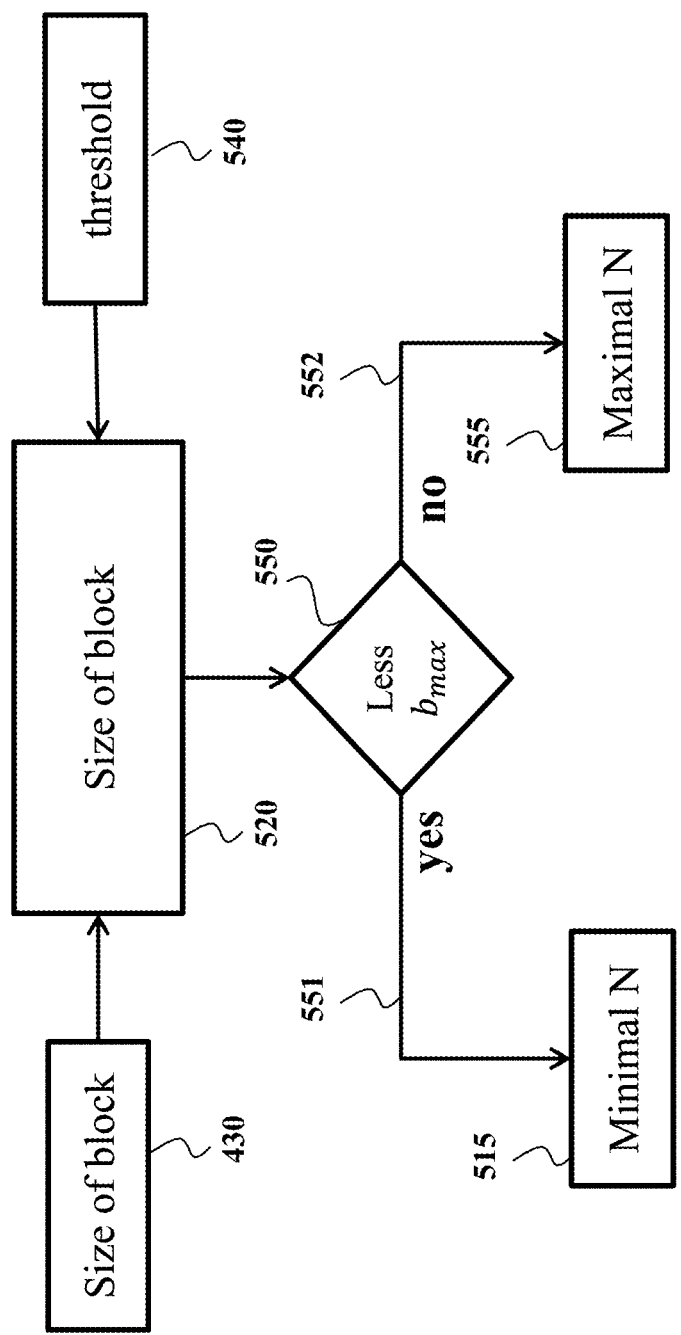
FIG. 5 is a block diagram of a method for selecting a number of iterations N for a LAS method according to some embodiment of the invention.

FIG. 5 shows a block diagram of selecting a maximal number of iterations N for the LAS method in dependence of the size of the block and/or the value of M. In this embodiment, the decoder compares 520 the size of the block 430 with a threshold 540, and selects 550 the minimal value of N 515, e.g., N=1, for the LAS method if a size of the block is less 551 than a threshold, and otherwise 552 selects a maximal value of iterations N, e.g., no more than 5-10 iterations are needed for convergence.

Exemplar Embodiment

One embodiment of the invention considers a point-to-point communication system with a single antenna at the transmitter and receiver. This embodiment considers frequency-flat fading for the channel that is quasi-stationary for K block symbols.

Figure 6:
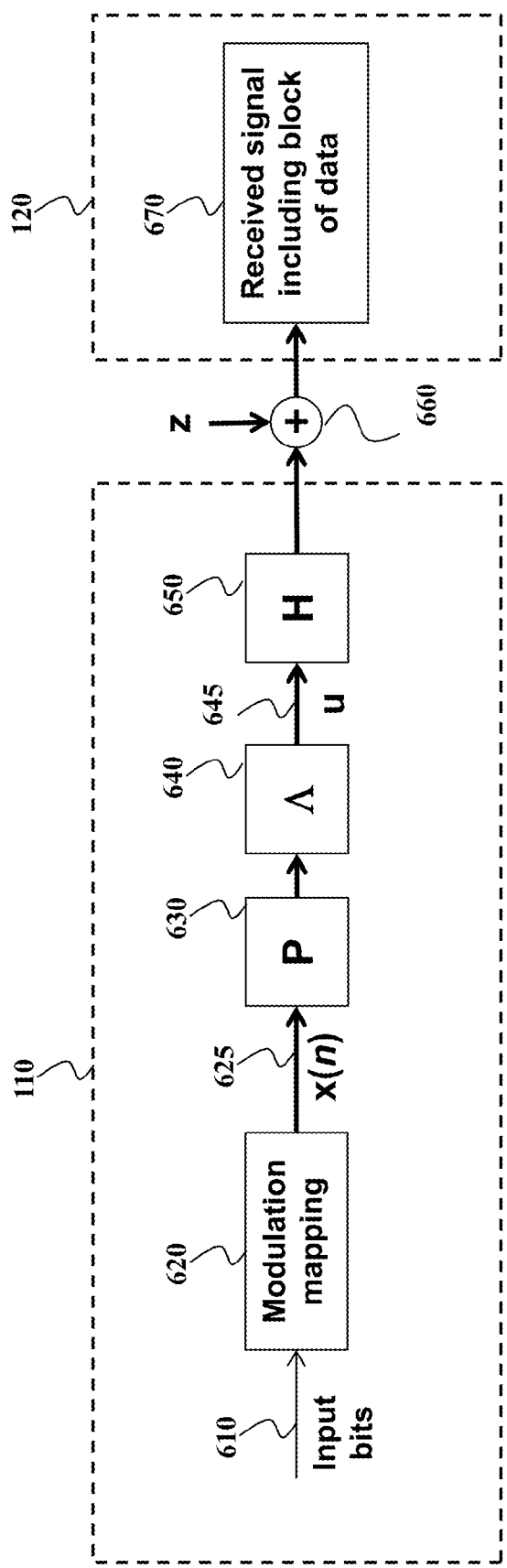
FIG. 6 is a block diagram of an exemplar wireless communication system according to some embodiment of the invention.

FIG. 6 shows a general block diagram of an exemplar wireless communication system including a transmitter 110 and a receiver 120 employing some principles of the invention. The transmitter modulates 620 the input bits 610 to produce symbols 625. Examples of the modulation 620 include but not limited to, BPSK (Binary Phase Shift Keying), QPSK (Quadrature Phase Shift Keying), M-ary QAM (Quadrature Amplitude Modulation). The symbols 625 can include a block of sequential symbols taken N at a time. For example, a vector x(n) can represent nth block comprising N modulation symbols. The modulated symbols can be assumed to have zero mean and unit power and are statistically independent, thus the following hold:

$$E\{x(n))\}=0 \text{ and } E\{x(n)x(n)^H\}=I_N,$$

wherein the operator E{ } represents the expectation and $I_N$ is an N×N identity matrix. The $j^{th}$ symbol transmission in the $n^{th}$ block is denoted by $x_j(n)$ in x(n), that is, u(n) also denotes a collection of symbols for N uses of the channel.

In some embodiments, the block of data is precoded 630 by an N×N unitary precoding matrix P. The matrix P can be any N×N unitary matrix, such as Discrete Fourier Transform (DFT) or Walsh-Hadamard matrices. One embodiment can also apply a random rotation 640 to the output of the precoder in the form of an N×N diagonal matrix with random complex entries along its diagonal. This rotation 640 can have the form $$\Lambda = \text{diag}(e^{j\theta_1}, e^{j\theta_2}, \ldots, e^{j\theta_N}),$$

wherein e is the number representing the base of the natural logarithm, j is the imaginary unit, i.e., $j=\sqrt{-1}$, and the $\theta_i$, i=1, 2, ... N are i.i.d uniform random variables over $\{0, 2\pi\}$. The rotation matrix has the effect of improving the bit error rate performance at higher signal to noise ratios.

Therefore, after application of the precoding matrix P and the phase rotation matrix, $\Lambda$, the input 645 to the channel H 650 is u=P$\Lambda$x(n). Because P and $\Lambda$ are unitary $(P\Lambda)(P\Lambda)^H = I_N$. The channel, H 650 can be modeled as an N×N diagonal matrix, $H=\text{diag}(h_1, h_2, \ldots h_N)$, where the N elements are complex normal random variables with unit variances. The white Gaussian noise z(n) is added 660 to the channel and the received signal 670 including the block of data is $$y(n) = HP\Lambda x(n) + z(n) = H_{eq}x(n) + z(n).$$

The above equation shows that the system can be viewed as an N×N virtual MIMO system with N-virtual spatial streams. Because the received vector signal y(n) is expressed by means of the block symbol x(n), the receiver 120 employs a decoder for a block-wise detection of the block symbol x(n) out of y(n) according to various embodiments of the invention.

Example of QRD-M Method

Figure 7:
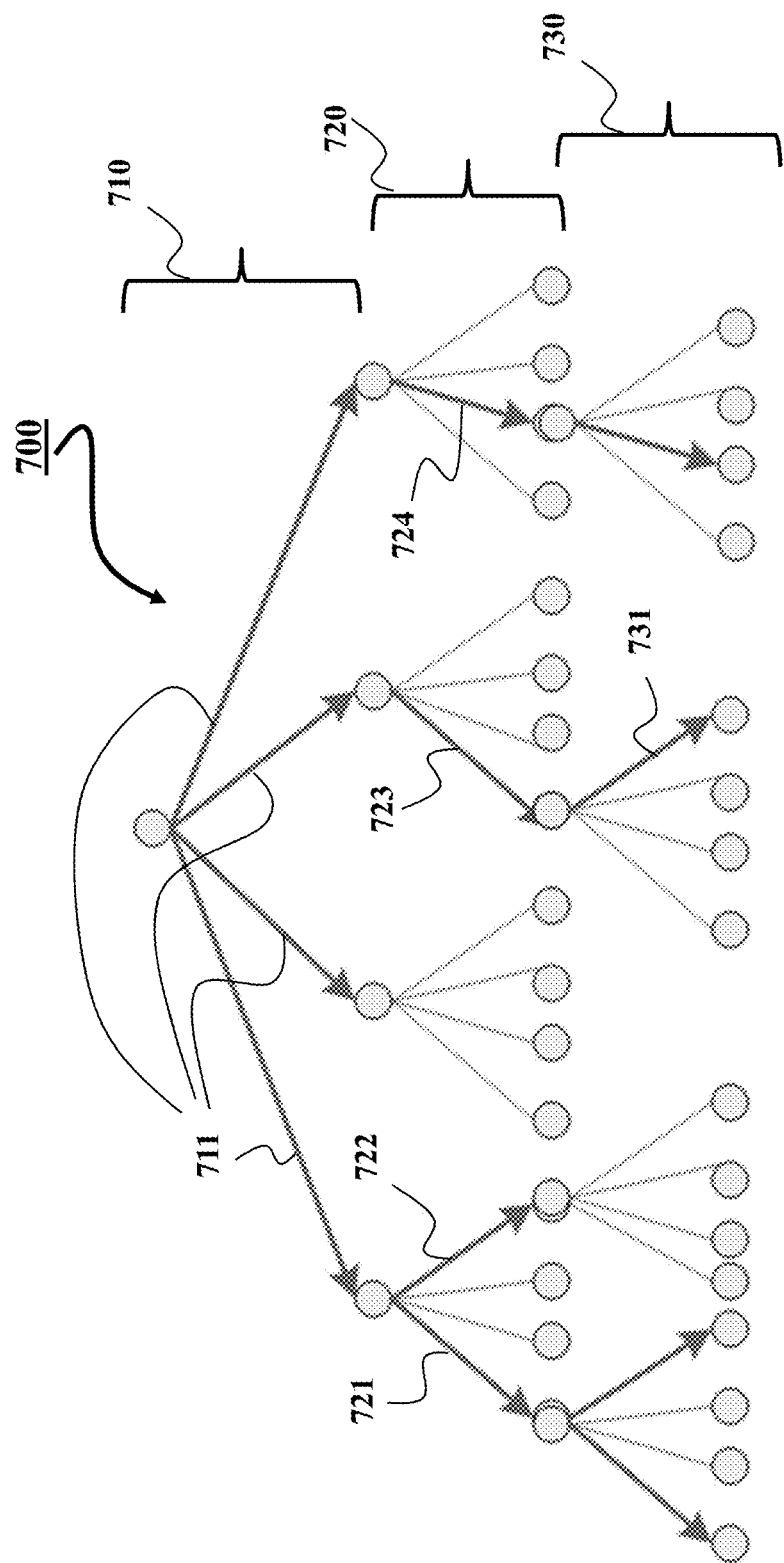
FIG. 7 is a schematic of a tree structure of the QRD-M method according to some embodiment of the invention.

FIG. 7 shows a schematic of a tree structure 700 of 3×3 MIMO system with QPSK modulation and M=4. Bold lines denote the survivor paths by means of the QRD-M algorithm. In this example, the tree structure for the detection of the system equipped with three antennas at the transmitter and receiver. The number of stages is the same as the number of antennas, so that there are three stages. This example uses QPSK for the transmission symbol and M=4 for the QRD-M, i.e., there are four survivor paths in the detection process. At each stage 710, 720, and 730, the accumulated Euclidean distance matric is computed for all available paths, and then only M paths (in this case four paths) are selected that have minimum accumulated Euclidean distances among all the paths.

In the first stage 710, because there are only four paths for four potential symbols when QPSK modulation is used, all the paths 711 are selected as survivor paths. At the second stage 720, the further computations of the accumulated Euclidean distances only computed from the survivor paths. That is, there are sixteen accumulated Euclidean distances corresponding to all paths, so only four survivor paths 721, 722, 723 and 724 are selected in the second stage. At the third stage 730, the QRD-M method selects the path, e.g., 731, which has the minimum accumulated Euclidean distance. This path gives the final data decision via the QRD-M, as the length N path from the root node down to the leaf node with the minimum accumulated Euclidean distance represents the sequence of symbols that are the most likely to have been transmitted.

Figure 8:
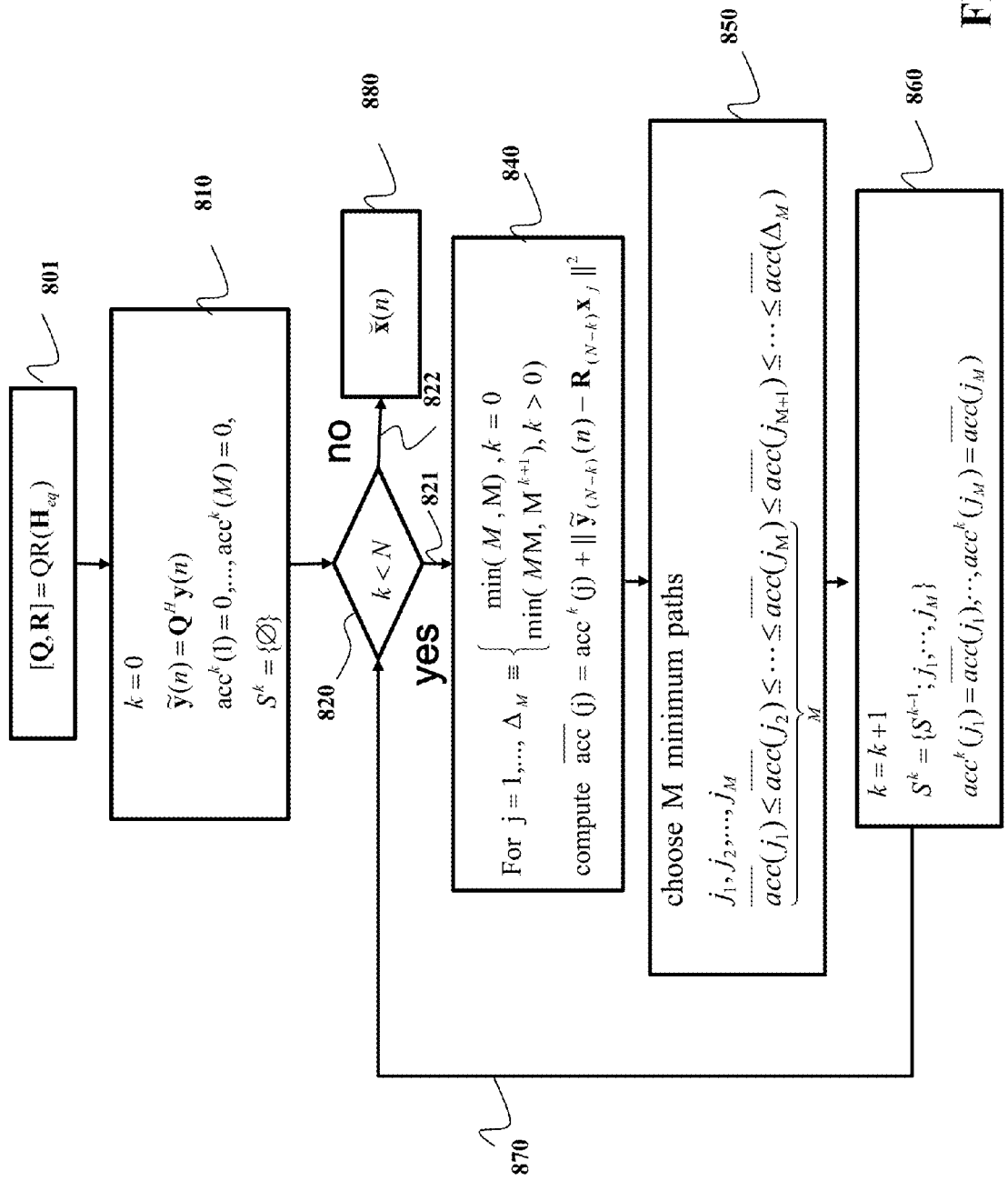
FIG. 8 is a block diagram of the QRD-M method according to some embodiment of the invention.

FIG. 8 shows a block diagram of the QRD-M method according to one embodiment of the invention. The embodiment, for an equivalent channel matrix $H_{eq}$, applies the QR decomposition 801 to determine $[Q, R]=QR(H_{eq})$, i.e., $QR=H_{eq}$, where Q is unitary matrix and R upper triangular matrix and multiply 810 y(n) by the Hermitian matrix of $Q^H$ to y(n) to generate $\tilde{y}(n)=Q^H y(n)$.

The embodiment also initialize a counter k=0, a set of M accumulators ($acc^k(1)=0, \ldots, acc^k(M)=0$), and a set of survivor paths $S^k=\{\emptyset\}$. If 820 k is smaller 821 than the block size N 820, for a possible number of branches, $$\Delta_M = \begin{cases} \min(M, \mathbb{M}), k = 0 \\ \min(M\mathbb{M}, \mathbb{M}^k), k > 0 \end{cases}$$

The embodiment computes 840 the accumulated Euclidean distances $\overline{acc}(j)=acc^k(j)+\|\tilde{y}_{(N-k)}(n)-R_{(N-k)}x_j\|^2$ for $j=1, 2, \ldots, \Delta_M$, where $\tilde{y}_{(N-k)}(n)$ is the (N-k)th element of $\tilde{y}(n)$, $R_{(N-k)}$ is the (N-k)th row vector of R and $x_j$ is the constellation symbol on the jth branch.

Next, the embodiment selects 850, among all $\Delta_M$ branches, only M branches having minimum accumulated Euclidean distance, such as M branches, $(j_1, j_2, \ldots, j_M)$, and their corresponding accumulated Euclidean distances $(\overline{acc}(j_1), \ldots, \overline{acc}(j_M))$.

The embodiment increases 860 the counter k by one, and updates survivor paths with its previous survivor paths $S^k=\{S^{k-1}; (j_1, j_2, \ldots, j_M)\}$, and accumulated Euclidean distance ($acc^k(j_1)=\overline{acc}(j_1), \ldots, acc^k(j_M)=\overline{acc}(j_M)$). The iterations that return 870 back to the test 820. When k=N 880, the embodiment traces back the survivor paths $S^k$ having minimum accumulated Euclidean distance at k=N, so that the data decision $\check{x}(n)$ can be made.

Example of LAS Method

Figure 9:
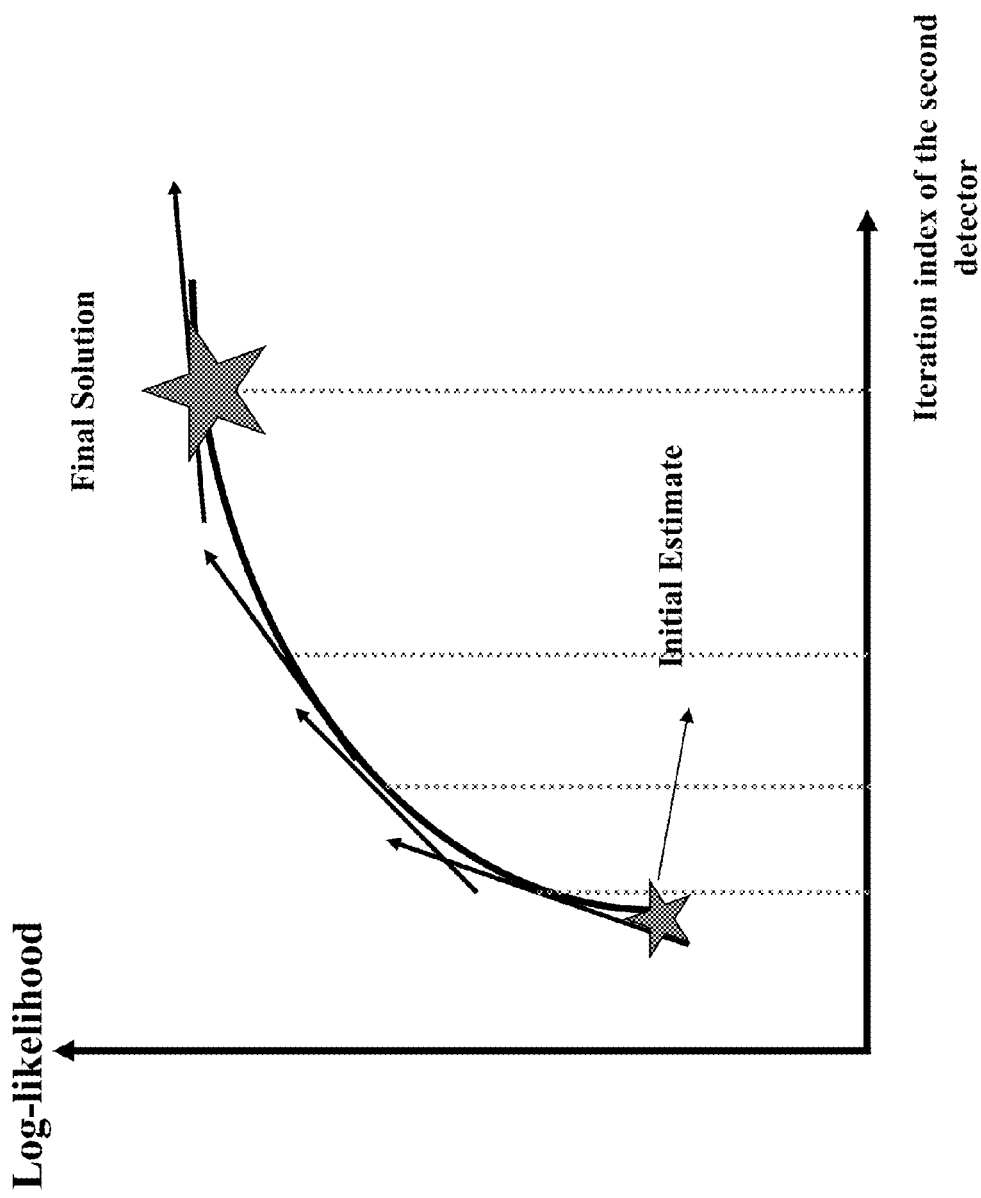
FIG. 9 is a graph of log-likelihood as a function of iterations for the LAS method according to one embodiment of the invention.

FIG. 9 shows a graph of log-likelihood as a function of iterations for the LAS method according to some embodiments of the invention. The LAS algorithm, as noted previously, is a greedy search algorithm which seeks to improve upon its current estimate by finding a data vector x that has a larger likelihood at each iteration. Details of how the search is carried are described below, and FIG. 9 is intended to show that for every iteration the candidate solution has a larger likelihood value than the previous value. In fact, if the current candidate solution cannot improve upon the previous solution the algorithm terminates as it has either found the global optimal solutions or has settled at a local maximum.

Figure 10:
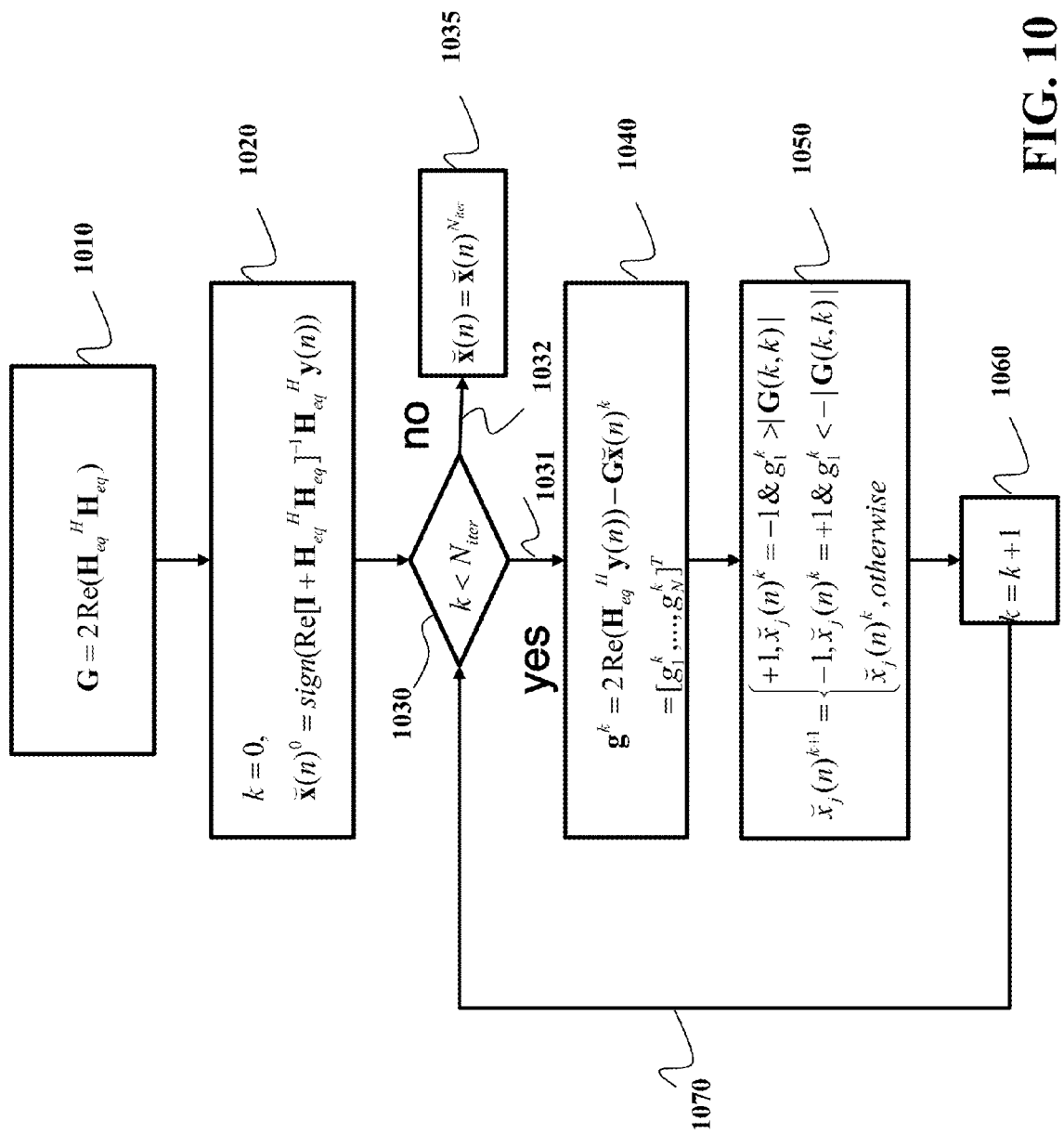
FIG. 10 shows a block diagram of the LAS method according to one embodiment of the invention.

FIG. 10 shows a diagram of an implementation of the LAS method according to one embodiment. This embodiment assumes that BPSK modulation is used in the transmitter, which is equivalent to setting $\mathbb{M}=2$. From expression for the received signal y(n), the matrix G is defined 1010 using an equivalent channel matrix as $G=2Re(H_{eq}^H H_{eq})$, and an initial estimate of the symbol block $\check{x}^{(0)}(n)$ is formed, 202. One example of the initial estimate is $$\check{x}^{(0)}(n)=sgn(Re[I+H_{eq}^H H_{eq}]^{-1}H_{eq}^H y(n)).$$

At k=0, where k denotes the number of iterations, an initial estimate of the block symbol is formed, 1020. For a given iteration, k 1030 which is smaller 1031 than $N_{iter}$, the embodiment computes the N by 1 vector $g^{(k)}$, whose jth element is denoted by $g_j^k$, 1040. The computation uses the equivalent channel $H_{eq}$ and the previous data vector estimate $\check{x}^{(k)}$ to determine $$g^k=2Re(H_{eq}y-G\check{x}^{(k)})$$

Next, the embodiment updates 1050 the estimate of the $j^{th}$ symbol of $\check{x}^{(k)}$ comparing $g_j^k$ with the magnitude of the kth diagonal element of the matrix G considering the estimated symbol in the previous iteration, and proceed 1070 to the next symbol. When the required number of iterations $N_{iter}$ is reached 1032, the data detection is obtained 1035.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for decoding a block of data transmitted over a communication channel, comprising:
   receiving a block of data transmitted over a communication channel;
   determining a size of the block of data;
   selecting based on the size of the block at least one of a value of M for the QRD-M method and a number of the iterations for the LAS method, wherein M is a number of surviving paths in each stage of the QRD-M method;
   determining an initial estimate of bits in the block using a QR decomposition (QRD-M) method, wherein the QRD-M method decodes the bits in the block sequentially by reducing an accumulated distance between the initial estimate and the bits of the block; and
   determining the block using a likelihood ascent (LAS) method, wherein the LAS method iteratively updates the bits of the block starting from the initial estimate, wherein steps of the method are performed by a processor of a receiver.

2. The method of claim 1, further comprising:
   selecting a maximal value of M for the QRD-M method according to a size of a memory of the receiver and a computational speed of the processor;
   selecting the maximal value of M for the QRD-M method if the size of the block is less than a threshold; and otherwise
   selecting a value of M less than the maximal value of M.

3. The method of claim 2, wherein the maximal value of M is $M=N*\bar{M}$, wherein N is a number of iterations of the LAS method, and $\bar{M}$ is a size of an alphabet for values of the bits in the block.

4. The method of claim 2, wherein the maximal value of M is a maximal number of branches of the LAS method that can be stored in a memory of the receiver.

5. The method of claim 1, further comprising:
   determining the size of the block from a data packet header communicated with the block.

6. The method of claim 1, further comprising:
   minimizing a number of iterations of the LAS method, if the size of the block is less than a threshold.

7. A receiver, comprising:
   at least one antenna for receiving a block of data over a communication channel; and
   a processor for decoding the block of data, wherein the processor is configured for determining an initial estimate of bits in the block using a QR decomposition (QRD-M) method decoding the block sequentially by reducing an accumulated distance between the initial estimate and the bits of the block, and decoding the block using a likelihood ascent (LAS) method iteratively updating the bits of the block starting from the initial estimate, wherein the processor determines a size of the block and selects, based on the size of the block, at least one of a value of a number M of surviving paths in each stage of the QRD-M method and a number of the iterations for the LAS method.

8. The receiver of claim 7, further comprising:
   a memory storing a maximal value of M determined based on a size of the memory of the receiver and a computational speed of the processor, wherein the processor selects from the memory the maximal value of M for the QRD-M method if the size of the block is less than a threshold and otherwise determines the value of M less than the maximal value of M.

9. The receiver of claim 8, wherein the processor determines the maximal value of M as $M=N*\bar{M}$, wherein N is a number of iterations of the LAS method, and $\bar{M}$ is a size of an alphabet for values of the bits in the block.

* * * * *